(12) United States Patent
Basker et al.

(10) Patent No.: US 9,985,114 B2
(45) Date of Patent: *May 29, 2018

(54) FIN FIELD EFFECT TRANSISTOR STRUCTURE AND METHOD TO FORM DEFECT FREE MERGED SOURCE AND DRAIN EPITAXY FOR LOW EXTERNAL RESISTANCE

(71) Applicant: INTERNATIONAL BUSINESS MACHINES CORPORATION, Armonk, NY (US)

(72) Inventors: Veeraraghavan S. Basker, Schenectady, NY (US); Oleg Gluschenkov, Tannersville, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/435,974

(22) Filed: Feb. 17, 2017

(65) Prior Publication Data
US 2017/0162671 A1  Jun. 8, 2017

Related U.S. Application Data

(63) Continuation of application No. 14/945,037, filed on Nov. 18, 2015, now Pat. No. 9,620,416.

(51) Int. Cl.
*H01L 29/66* (2006.01)
*H01L 29/78* (2006.01)
(Continued)

(52) U.S. Cl.
CPC ...... *H01L 29/66636* (2013.01); *H01L 29/045* (2013.01); *H01L 29/0653* (2013.01);
(Continued)

(58) Field of Classification Search
CPC ......... H01L 29/66636; H01L 29/66795; H01L 29/66545; H01L 29/045; H01L 29/0653; H01L 29/0847; H01L 29/7851
See application file for complete search history.

(56) References Cited

U.S. PATENT DOCUMENTS 8,796,093 B1  8/2014 Cheng et al.
8,940,595 B2  1/2015 Chandra et al.
(Continued)

OTHER PUBLICATIONS

List of IBM Patents or Patent Applications Treated as Related dated Feb. 17, 2017, 2 pages.

*Primary Examiner* — Jay C Chang
*Assistant Examiner* — Charles R Peters
(74) *Attorney, Agent, or Firm* — Tutunjian & Bitetto, P.C.; Daniel P. Morris

(57) ABSTRACT

A method of forming a semiconductor device that includes providing a plurality of fin structures, wherein a surface of the fin structures has a first orientation for a diamond shaped epitaxial growth deposition surface. A first epitaxial semiconductor material having a diamond geometry is grown on the diamond shaped epitaxial growth surface. A blocking material is formed protecting a lower portion of the first epitaxial semiconductor material. An upper portion of the first epitaxial semiconductor material is removed to expose a second orientation surface of the first epitaxial semiconductor material for merged epitaxial semiconductor growth. A second epitaxial semiconductor material is epitaxially formed on the first epitaxial semiconductor material. The second epitaxial semiconductor material has a substantially (Continued)

planar upper surface and extends into direct contact with at least two adjacent fin structures.

17 Claims, 7 Drawing Sheets

(51) Int. Cl.
*H01L 29/06* (2006.01)
*H01L 29/08* (2006.01)
*H01L 29/04* (2006.01)

(52) U.S. Cl.
CPC .... *H01L 29/0847* (2013.01); *H01L 29/66545* (2013.01); *H01L 29/66795* (2013.01); *H01L 29/7851* (2013.01)

(56) References Cited

U.S. PATENT DOCUMENTS

| | | | |
|---|---|---|---|
| 8,946,033 B2 | 2/2015 | Adam et al. | |
| 8,993,406 B1 | 3/2015 | Kerber et al. | |
| 2014/0183605 A1* | 7/2014 | Mochizuki | H01L 29/66795 257/288 |
| 2015/0069531 A1* | 3/2015 | Naczas | H01L 23/535 257/410 |
| 2015/0084096 A1 | 3/2015 | Chandra et al. | |
| 2015/0179789 A1 | 6/2015 | Kerber et al. | |
| 2015/0228761 A1* | 8/2015 | Cheng | H01L 29/66795 257/365 |

* cited by examiner

FIN FIELD EFFECT TRANSISTOR STRUCTURE AND METHOD TO FORM DEFECT FREE MERGED SOURCE AND DRAIN EPITAXY FOR LOW EXTERNAL RESISTANCE

BACKGROUND

Technical Field

The present disclosure relates to semiconductor devices, such as semiconductor devices including fin structures. The present disclosure further relates to processing of materials suitable for use in fin including structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET).

SUMMARY

In one aspect, a method of forming a semiconductor device is provided that includes merged epitaxial semiconductor material. In some embodiments, the method of forming a semiconductor device may begin with providing a plurality of fin structures in which a surface of the fin structures has a first orientation for a diamond shaped epitaxial growth deposition surface. A first epitaxial semiconductor material having a diamond geometry is grown on the diamond shaped epitaxial growth surface. A blocking material is deposited protecting a lower portion of the first epitaxial semiconductor material and leaving an upper portion of the first epitaxial semiconductor material exposed. An etch process removes the upper portion of the first epitaxial semiconductor material to expose a second orientation surface of the first epitaxial semiconductor material for merged epitaxial semiconductor growth. A second epitaxial semiconductor material is epitaxial formed on the first epitaxial semiconductor material, the second epitaxial semiconductor material having a substantially planar upper surface and extending into direct contact with at least two adjacent fin structures of said plurality of fin structures.

In another embodiment, the method of forming a semiconductor device may begin with providing a plurality of fin structures in which a sidewall of the fin structures has a first orientation for a diamond shaped epitaxial growth deposition surface. A first epitaxial semiconductor material having a diamond geometry is grown on the diamond shaped epitaxial growth deposition surface. A blocking material is deposited protecting a lower portion of the first epitaxial semiconductor material and leaving an upper portion of the first epitaxial semiconductor material exposed. An etch process removes the upper portion of the first epitaxial semiconductor material to expose a (110) orientation surface upper surface for the first epitaxial semiconductor material. A second epitaxial semiconductor material is formed on at least the (100) orientation surface of first epitaxial semiconductor material having a rectangular geometry, wherein the rectangular geometry provides a merged epitaxial material that extends into direct contact with at least two adjacent fin structures of said plurality of fin structures.

In another aspect of the present disclosure, an electrical device is provided that includes a plurality of fin structures and multi-component merged epitaxial semiconductor material on the source and drain region portions of the plurality of fin structures. The multi-component merged epitaxial semiconductor material including a first component comprising angled sidewalls and an increasing width from a base of the first component of the epitaxial material to an interface with a second component of the multi-component merged epitaxial semiconductor material. The first component of the multi-component merged epitaxial semiconductor material is not composed of merged epitaxial material. The second component of the multi-component merged epitaxial semiconductor material being in direct contact with an upper surface of the first component and is composed of merged epitaxial semiconductor material having a substantially planar upper surface.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
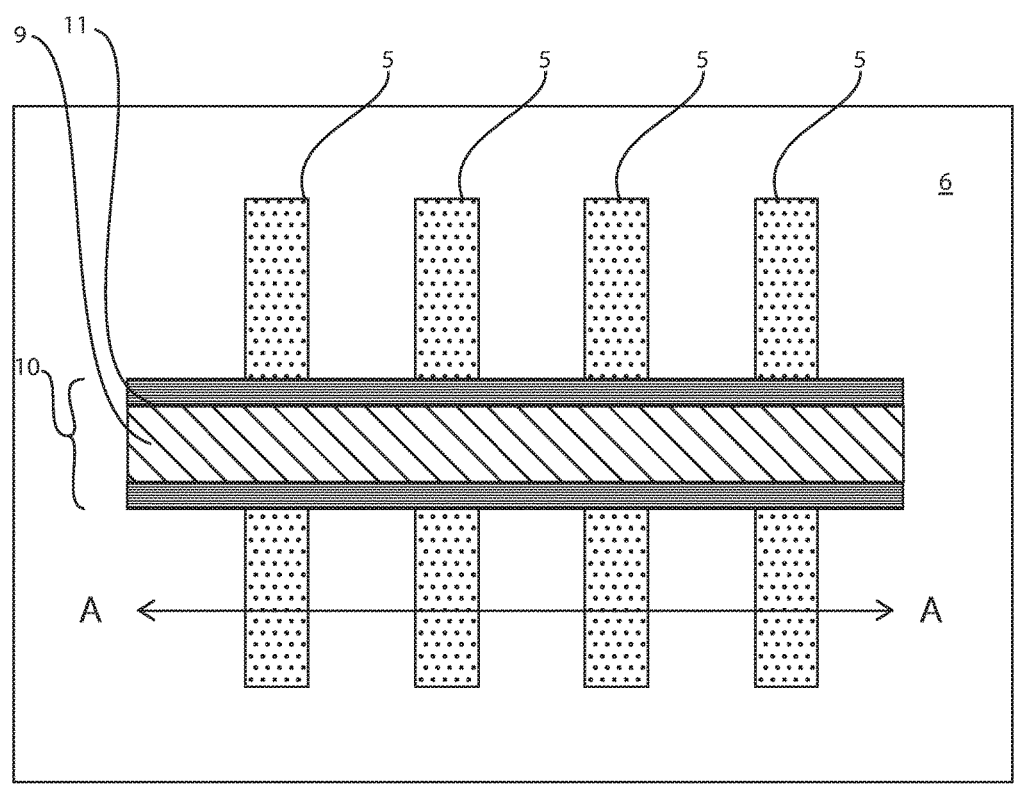
FIG. 1 is a top-down view depicting a plurality of fin structures and a gate structure, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET semiconductor devices in which merged epitaxial semiconductor material is formed on the source and drain region portions of the fin structures. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure. The source and drain regions of the fin structure are the portions of the fin structure that are on opposing sides of the channel region of the fin structure.

Epitaxial semiconductor material is semiconductor material that is formed using an epitaxially deposition/epitaxial growth. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

The epitaxial semiconductor material that is formed on the source and drain region portions of the fin structure contribute to the source and drain region portions of the semiconductor device. The term "merged" means that a portion of epitaxial semiconductor material grows from one structure, i.e., first fin structure, to an adjacent second structure, i.e., at least a second fin structure.

Merged epitaxy, i.e., merged epitaxial semiconductor material, for source and drain (S/D) contact formation for use with fin structures has been determined to have the lowest external resistance (Rext) due to the fact that more volume of dopants are available in the epitaxial material in comparison to contacts formed to the semiconductor surface of fin structures not including epitaxially grown semiconductor material. Decreasing the external resistance of contacts using merged epitaxial semiconductor material can be become advantageous as the fin structures are scaled down to pitches below 30 nm, because in some examples, the available area for epitaxial growth becomes small.

Because the epitaxial semiconductor material that is grown on the source and drain region portions of the fin structures is typically grown on a (110) surface, the epitaxial semiconductor material is grown as a diamond self-terminating on (111) plane, which can result in a lot of non-selective epitaxial growth if one tries to merge fins using epitaxy semiconductor in this fashion.

In accordance with some of the embodiments of the present disclosure, epitaxial semiconductor material that is formed on the source and drain region portions of the fins structures is first grown as small diamonds terminating in the (111) plane. In a following process step, the bottom-half of the diamonds of epitaxial semiconductor material may then be blocked using an oxide layer, and the top half of the epitaxial semiconductor material may then be etched. In some embodiments, the etch process continues until the resultant plane that is exposed is (100). With the (100) plane, epitaxial semiconductor material may be grown uniformly to merge the source and drain portions of the fin structures. In some embodiments, the resultant structure has a low external resistance (Rext), as well as low parasitic capacitance, since the bottom half of the diamond is filled with oxide leading to lower gate conductor/gate conductor contact (PC)-to-epitaxial semiconductor material (EPI) parasitic capacitance. The methods and structures of the present disclosure are now discussed with more detail referring to FIGS. 1-7.

Figure 2:
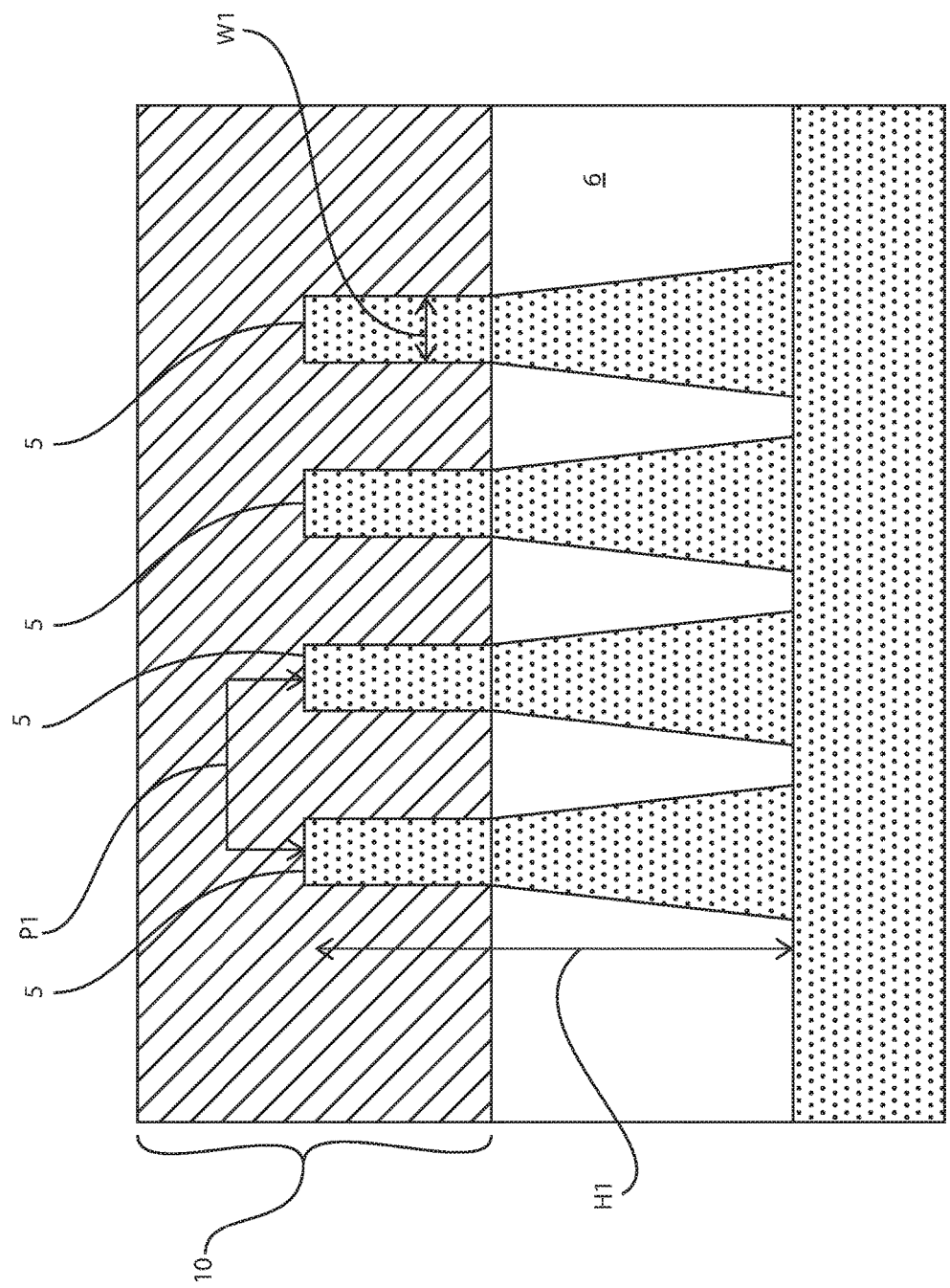
FIG. 2 is a side cross-sectional view (hereafter referred to as an across-fin side cross-section) along section line A-A of FIG. 1.

FIGS. 1 and 2 depict one embodiment of forming a plurality of fin structures 5 from a semiconductor substrate 1. The fin structures 5 are typically formed from a (100) surface of the semiconductor substrate 1. Wafers are typically grown from crystal having a regular crystal structure, with silicon having a diamond cubic structure with a lattice spacing of 5.430710 Å (0.5430710 nm). When cut into wafers, i.e., semiconductor substrates 1, the cut surface is aligned in one of several relative directions known as crystal orientations. Orientation is defined by the Miller index. In accordance with some embodiments, the upper surface, i.e., upper face, of the substrate has a (100) orientation.

In some embodiments, a plurality of silicon including fin structures 5 may be formed from a semiconductor on insulator (SOI) substrate or a bulk semiconductor substrate 1. The SOI substrate that may provide the semiconductor substrate may include at least a semiconductor on insulator (SOI) layer overlying a dielectric layer, in which a base semiconductor layer may be present underlying the dielectric layer.

The plurality of fin structures 5 may be formed from the semiconductor substrate 1 using photolithography and etch processes. The plurality of fin structures 5 may be patterned from the semiconductor substrate 1 to provide a length along, i.e., parallel to, the <110> crystalline direction. The length of the fin structures 5 is typically defined from an outermost edge of a source region portion of the fin structure across the channel region of the fin structure 5 to an outermost edge of the drain region portion of the fin structure 5.

In one embodiment, the patterning process used to define each of the fin structures 5 is a sidewall image transfer (SIT) process. The SIT process can include forming a mandrel material layer (not shown) on the material layer that provides the fin structures 5, such as the SOI layer of an SOI substrate, or the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 10, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process, such as, e.g., reactive ion etching (RIE). Since the dielectric spacers are used in the SIT process as an etch mask, the width of the each dielectric spacer determines the width of each fin structure 5.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 5, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structures 5. Following etching, i.e., pattern transfer, the SIT process may conclude with removing the dielectric spacers using an etch process or a planarization process.

It is noted that the aforementioned spacer image transfer (SIT) process is only one method of forming the fin structures 5. In another embodiment, each of the fin structures 5 may be formed using a photoresist etch mask. Specifically, in one example, a photoresist mask is formed overlying the semiconductor composition layer which provides the fin structures 5. The exposed portions of the semiconductor layer that provides the fin structures 5 that are not protected by the photoresist mask are removed using a selective etch process. To provide the photoresist mask, a photoresist layer is first positioned on the semiconductor layer that provides the fin structure 5, e.g., SOI layer of an SOI substrate or upper surface of bulk semiconductor substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 5. The etch process may be an anisotropic process, such as reactive ion etch (RIE).

The sidewalls of the fin structures may have a (110) crystalline surface. As will be described below epitaxial semiconductor material, i.e., the first epitaxial semiconductor material 15, that is grown on these surfaces will have a diamond shaped geometry, and will be self-terminating on the (111) plane. By self-terminating it is meant that the growth rate of the 111 plane is very slow, so timed epitaxy will lead to that structure, because once the (111) plane is formed the growth rate slows down considerably.

Referring to FIG. 2, the fin structures 5 may have a height $H_1$ ranging from 5 nm to 200 nm. In another embodiment, the fin structures 5 may have a height $H_1$ ranging from 10 nm to 100 nm. In one example, the fin structures 5 may have a height $H_1$ ranging from 20 nm to 50 nm. Each of the fin structures 5 may have a width $W_1$ of less than 20 nm. In another embodiment, the fin structures 5 have a width $W_1$ ranging from 3 nm to 8 nm. The pitch separating adjacent fin structures 5 may range from 10 nm to 500 nm. In another example, the pitch separating adjacent fin structures in the plurality of fin structures 5 may range from 20 nm to 50 nm.

In some embodiments, the fin structures 5 may be composed of a silicon including material that provides the semiconductor substrate 1, which may include, but is not limited to, silicon, single crystal silicon, multicrystalline silicon, polycrystalline silicon, amorphous silicon, strained silicon, silicon doped with carbon (Si:C), silicon alloys or any combination thereof. The fin structures 5 may also be composed of germanium including semiconductor materials, such as silicon germanium (SiGe) or germanium (Ge). The fin structures 5 may also be composed of a type III-V semiconductor material, such as gallium arsenide (GaAs).

FIGS. 1 and 2 also depict filling the space between the adjacent fin structures 5 with a fill dielectric material 6 (which may be referred to as dielectric regions 6 or isolation regions). The dielectric regions 6 may be composed of a nitride, oxide, oxynitride material, and/or any other suitable dielectric layer. For example, when the dielectric regions 6 are composed of an oxide, the dielectric regions 6 can be silicon oxide ($SiO_2$). In another example, when the dielectric regions 6 are composed of a nitride, the dielectric regions 6 can be silicon nitride. The dielectric regions 6 can be formed by a deposition process, such as CVD. Variations of CVD processes include, but not limited to, Atmospheric Pressure CVD (APCVD), Low Pressure CVD (LPCVD) and PECVD, Metal-Organic CVD (MOCVD) and combinations thereof. Alternatively, the dielectric regions 6 may be formed using a growth process, such as thermal oxidation or thermal nitridation.

The dielectric regions 6 may be recessed using a selective etch process to provide an exposed portion of the upper portion of the fins structures 5. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In some embodiments, the dielectric regions 6 are removed by an etch that is selective to the fin structures 5. The etch process for removing the dielectric regions 6 may be an anisotropic etch or an isotropic etch. In some examples, the etch process may be a wet chemical etch, reactive ion etch (RIE), plasma etch, laser etch and combinations thereof.

Still referring to FIGS. 1 and 2, in one embodiment, a gate structure 10 may be formed contacting the channel region of the fin structures 5. The gate structure 10 is typically a sacrificial gate structure. The term "sacrificial" as used to describe the replacement gate conductor denotes that the structure is present during the process sequence, but is not present in the final device structure, in which the replacement structure provides an opening that dictates the size and geometry of a later formed functional gate conductor.

The sacrificial material that provides the sacrificial gate structure 10 may be composed of any material that can be etched selectively to the underlying fin structures 5. In one embodiment, the sacrificial material that provides the sacrificial gate structure 10 may be composed of a silicon-containing material, such as polysilicon. Although, the sacrificial gate structure 10 is typically composed of a semiconductor material, the sacrificial gate structure 10 may also be composed of a dielectric material, such as an oxide, nitride or oxynitride material, or amorphous carbon.

The sacrificial material may be patterned and etched to provide the sacrificial gate structure 10. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the sacrificial gate structure 10, while the exposed regions are removed using a selective etching process that removes the unprotected regions. Following formation of sacrificial gate structure 10, the photoresist may be removed. At least one dielectric gate spacer 11 may then be formed on the sidewall of the gate structure 10. In one embodiment, the dielectric gate spacer 11 may be formed by using a blanket layer deposition, such as CVD, and an anisotropic etchback method. The dielectric gate spacer 11 may have a width ranging from 2.0 nm to 15.0 nm, and may be composed of a dielectric, such as a nitride, oxide, oxynitride, or a combination thereof. It is noted that the dielectric gate spacer 11 is depicted in FIG. 1, but is not depicted in remaining FIGS. 2-7 for simplicity.

Figure 3:
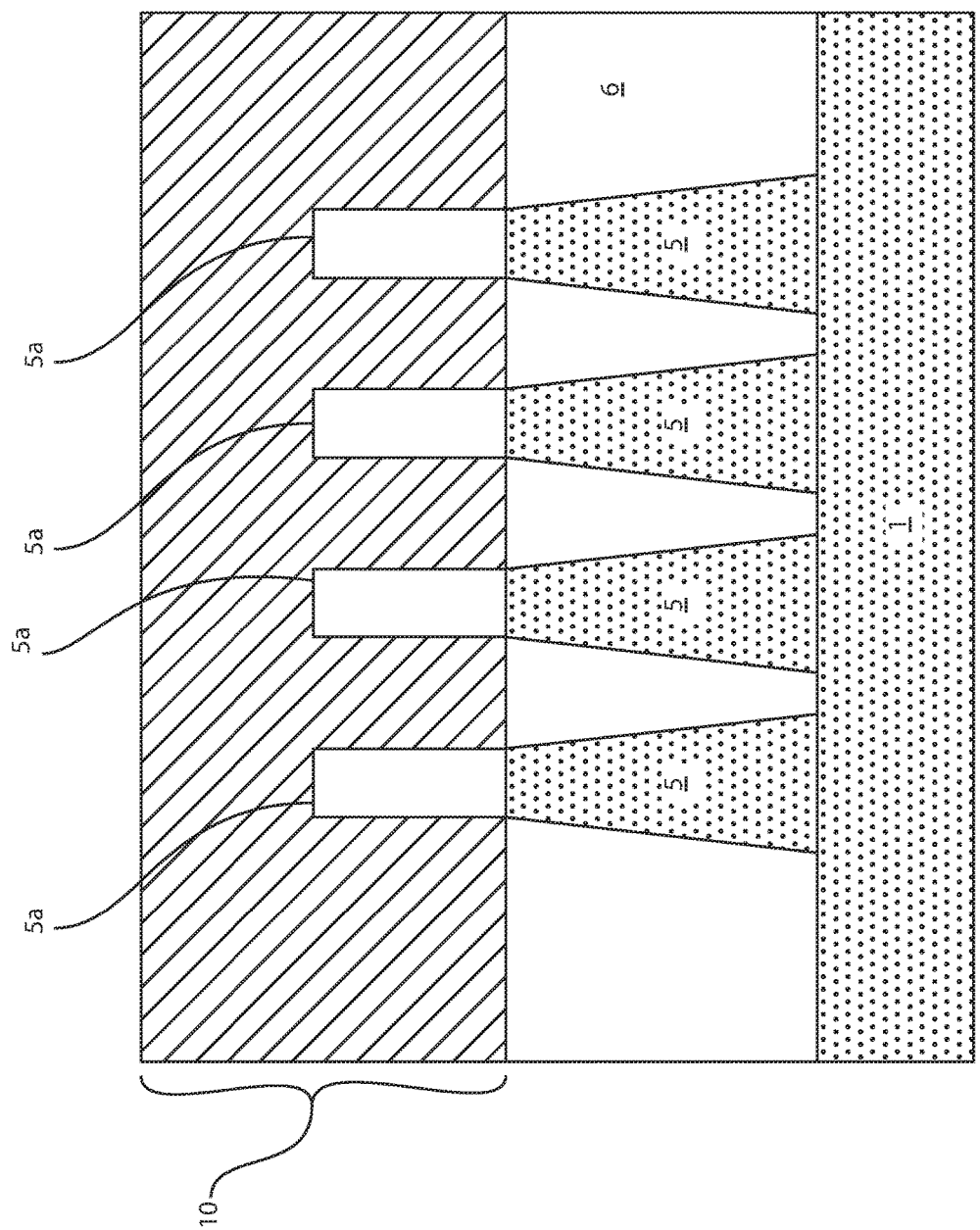
FIG. 3 is an across-fin side cross-sectional view of recessing the fin structures depicted in FIG. 2, in accordance with one embodiment of the present disclosure.

FIG. 3 depicts one embodiment recessing the source and drain portions of the fin structures depicted in FIG. 2. The source and drain region portions of the fin structures are the portions of the fin structures that are on opposing sides of the portion of the fin structure, i.e., channel portion, that the gate structure 10, as well as the gate spacers 11, is present on. In the view provided by FIGS. 2-7, the source and drain portions of the fin structures 5 extend into and out of the page. Therefore, the source and drain region portions of the fin structures 5 are exposed, while the channel portion of the fin structures 5 is protected by at least the gate structure 10, and the gate sidewall spacers 11.

The source and drain region portions of the fin structures 5 may be recessed to a height that is substantially coplanar with an upper surface of the dielectric regions 6 between the adjacent fin structures 5. The source and drain region portions of the fin structures 5 may be recessed with an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. The etch process may also be timed and/or employ end point detection methods to determine when the etch process has recessed the upper surface of the fin structures 5 to be substantially coplanar with the upper surface of the dielectric regions 6. During the etch process, the channel portion of the fin structures 5 is protected by the sacrificial gate structure 10, as well as the gate sidewall spacers 11, or an etch mask that is formed over the channel portion of the fin structures.

The exposed surface 5a of the fin structures 5 that is substantially coplanar with the upper surface of the dielectric regions 6 typically has a crystal orientation that provides for diamond shaped epitaxial semiconductor material that is grown on the exposed surface 5a of the fin structures 5. In some embodiments, the crystalline orientation, i.e., first crystalline orientation that is provided by the recessed upper surfaces, i.e., exposed surface 5a, of the fin structures 5 is (100).

Figure 4:
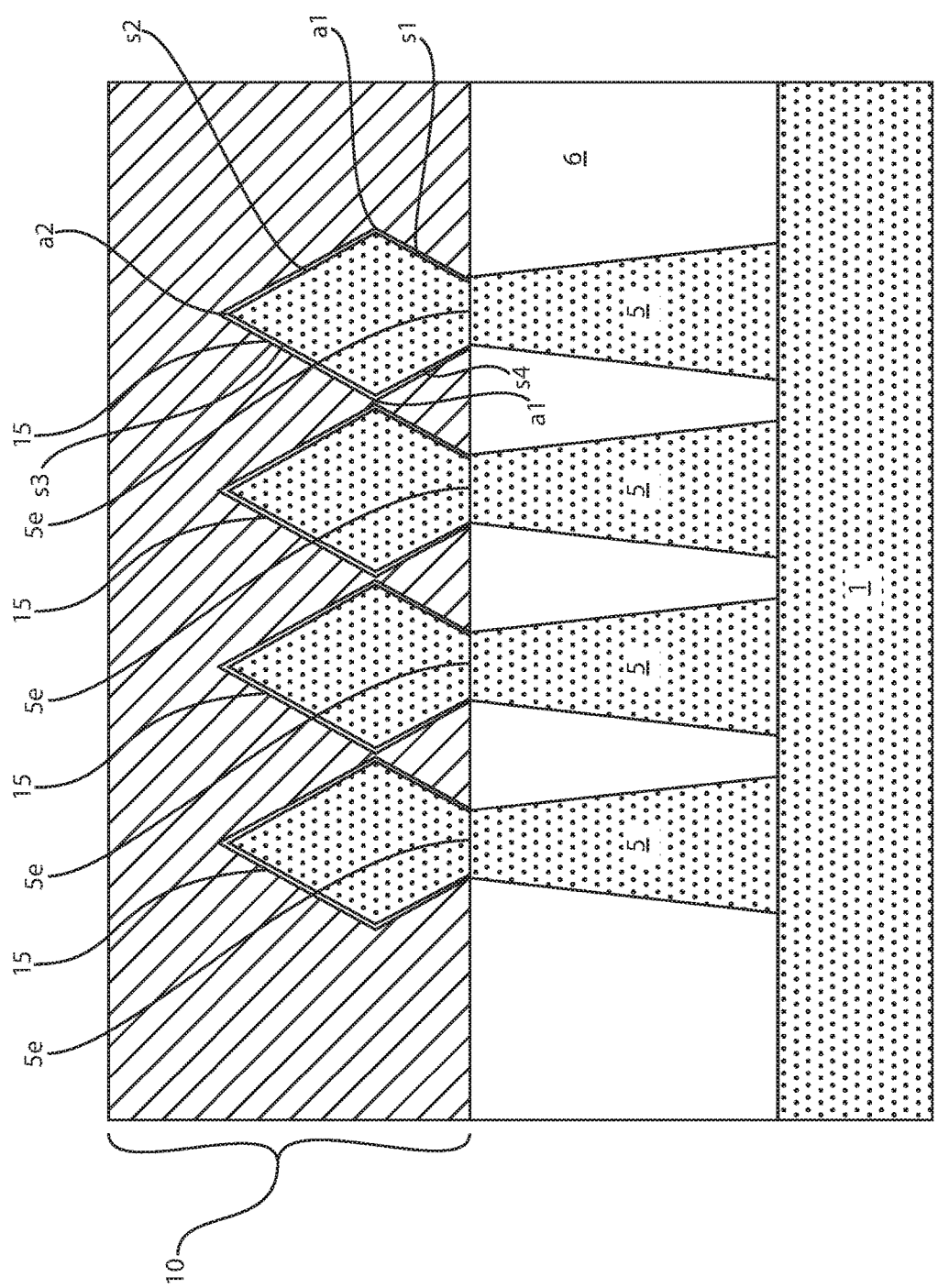
FIG. 4 is an across-fin side cross-sectional view of epitaxially forming a first epitaxial semiconductor material having a diamond geometry is grown on the diamond shaped epitaxial growth deposition surface, in accordance with one embodiment of the present disclosure.

FIG. 4 depicts one embodiment of epitaxially forming a first epitaxial semiconductor material 15 having a diamond geometry grown on the diamond shaped epitaxial growth deposition surface 5a of the source and drain region portions of the fin structures 5. The diamond like geometry of the first epitaxial semiconductor material will have a peaked sidewall or a sidewall having a first apex A1 on each sidewall of the epitaxial semiconductor material, as well as a single second apex A2 at an upper surface of the first epitaxial semiconductor material. The sidewalls S1, S2, S3, S4 extending to and from the apexes A1, A2 are substantially planar, i.e., are without significant curvature. In some embodiments, each sidewall of the first epitaxial semiconductor material 15 that are present on opposing sidewalls of the fin structures 5 will have a single apex A1 positioned approximately at half the height of the first epitaxial semiconductor material 15.

In some embodiments, the first epitaxial semiconductor material 15 may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. The first epitaxial semiconductor material 15 is grown using an epitaxial growth or deposition process. "Epitaxial growth and/or deposition" means the growth of a semiconductor material on a deposition surface of a semiconductor material, e.g., the exposed surface 5a of the fin structures 5 having the first orientation, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a{100} crystal surface will take on a {100} orientation.

In some embodiments, the first epitaxial semiconductor material 15 is formed using a selective deposition process. For example, although the epitaxially deposited first epitaxial semiconductor material 15 orientates to the crystal arrangement of a semiconductor material, the first epitaxial semiconductor material 15 may not be deposited on the dielectric material of the gate sidewall spacers 11, any dielectric gate cap that may be present atop the gate structure 10 or any dielectric block mask that may be present atop the gate structure 10.

A number of different sources may be used for the epitaxial deposition of the first epitaxial semiconductor material 15. For example, a silicon including first epitaxial semiconductor material 15 may be deposited from a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming the first epitaxial semiconductor material 15 includes germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

The first epitaxial semiconductor material 15 may terminate, e.g., self-terminate, along the (111) plane.

The first epitaxial semiconductor material 15 provides a portion of the source and drain regions of the semiconductor device including the fin structure, and therefore is typically doped to an n-type or p-type conductivity. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on. The conductivity type of the source and the drain regions typically dictates the conductivity type of the semiconductor device. The term "conductivity type" refers to whether the device is n-type or p-type. In the embodiments in which the FinFET device being formed has n-type source and drain regions, and is referred to as an n-type FinFET, at least one of the first epitaxial semiconductor material 15 and later formed second epitaxial semiconductor material 25 that provides the source and drain regions is doped with an n-type dopant to have an n-type conductivity. In the embodiments in which the FinFET device being formed has p-type source and drain regions, and is referred to as a p-type FinFET, at least one of the first epitaxial semiconductor material 15 and later formed second epitaxial semiconductor material 25 that provides the source and drain regions is doped to a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous. The dopant for the epitaxial semiconductor material that dictates the conductivity type of the first epitaxial semiconductor material 15 is typically present in a concentration ranging from 1E17 atoms/cm$^3$ to 5E19 atoms/cm$^3$.

The dopant for the first epitaxial semiconductor material 15 may be introduced to the semiconductor material by an in situ doping process. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type gas dopant source may include diborane ($B_2H_6$).

The epitaxial growth process may continue until the sidewall apexes A1 of the first epitaxial semiconductor material 15 that is present on adjacent fin structures 15 is close to touching. In some embodiments, the first epitaxial semiconductor material 15 is an unmerged semiconductor material. In some other embodiments, the first epitaxial semiconductor material 15 is deposited until the apexes A1 of the first epitaxial semiconductor material 15 on adjacent fin structures touches, therefore forming merged epitaxial semiconductor material.

Figure 5:
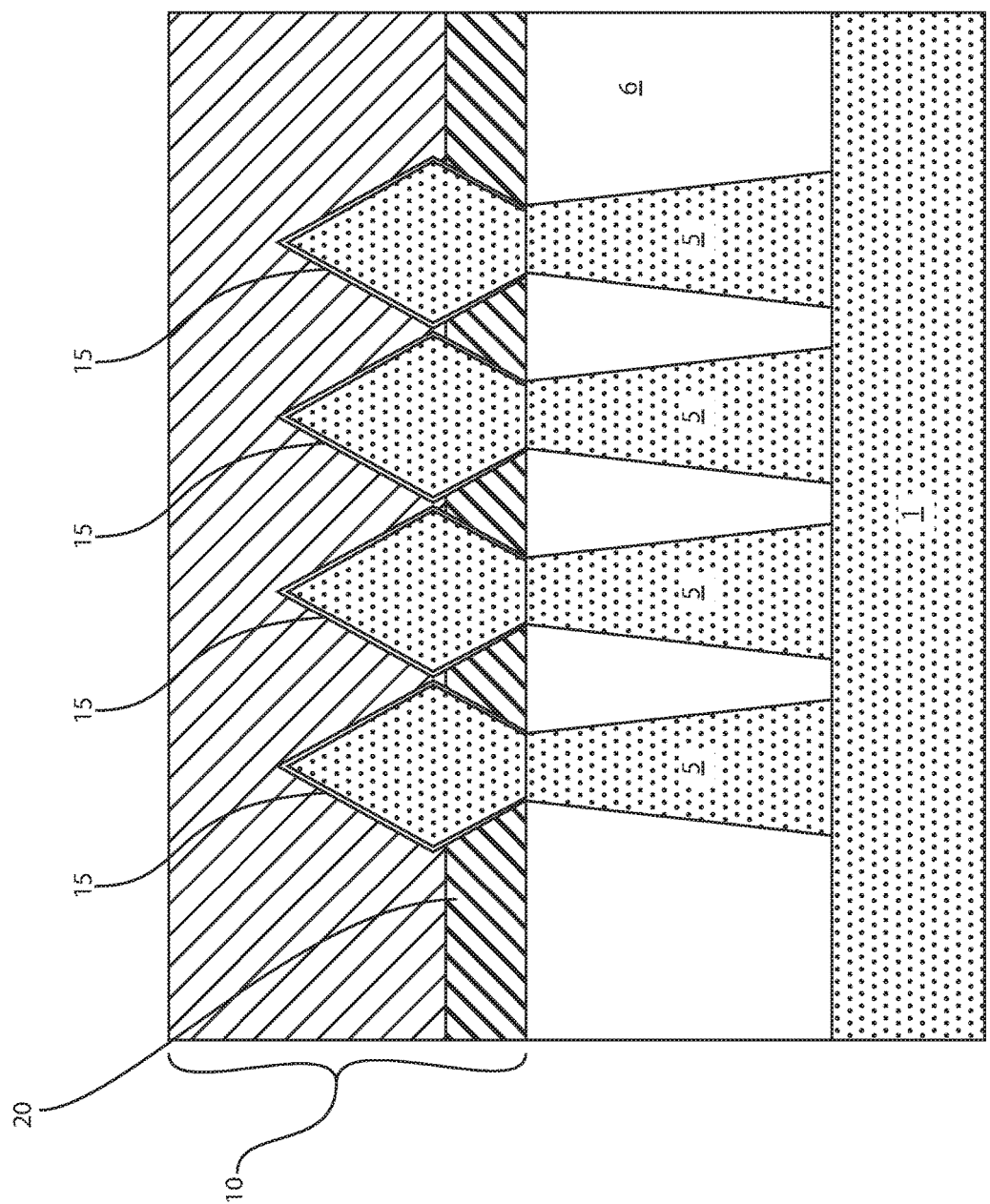
FIG. 5 is an across-fin side cross-sectional view depicting one embodiment of forming a blocking material protecting a lower portion of the first epitaxial semiconductor material and leaving an upper portion of the first epitaxial semiconductor material exposed.

FIG. 5 depicts one embodiment of forming a blocking material 20 protecting a lower portion of the first epitaxial semiconductor material and leaving an upper portion of the first epitaxial semiconductor material exposed. The blocking material 20 may be composed of a dielectric material. In some embodiments, the blocking material 20 is composed of a dielectric having a composition that is not etched by etch chemistries for removing an upper portion of the first epitaxial semiconductor material 15. For example, the blocking material 20 may be composed of an oxide, nitride or oxynitride material. In one embodiment, in which the blocking material 20 is an oxide, the blocking material 20 may be composed of silicon oxide. In one embodiment, in which the blocking material 20 is composed of a nitride, the blocking material 20 may be composed of silicon oxide. It is noted that the above materials are provided for illustrative purposes only, and are not intended to limit the present disclosure. For example, other low-k dielectric materials, i.e., dielectric materials having a room temperature dielectric constant of silicon oxide (4.0) or less, may include silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) and combinations thereof. It is noted that any dielectric material may be used, so long as the composition selected protects the lower portion of the first epitaxial semiconductor material 15, which the upper portion of the first epitaxial semiconductor material is removed using an etch process, as described below.

The blocking material 20 may formed in the opening that is present between the upper surface of the dielectric regions 6 and the sidewalls S1, S4 of the first epitaxial semiconductor material 15. The blocking material 20 can be deposited using chemical vapor deposition (CVD). Examples of chemical vapor deposition processes for forming the blocking material 20 include, but are not limited to, Atmospheric Pressure CVD (APCVD), Low Pressure CVD (LPCVD) and Plasma Enhanced CVD (PECVD), Metal-Organic CVD (MOCVD), low pressure CVD or flowable CVD. Spin on deposition may also be used to deposit the blocking material 20. In some embodiments, deposition process continues until the upper surface of the blocking material 20 is substantially coplanar with the sidewall apex A1 of the first epitaxial semiconductor material 15.

Figure 6:
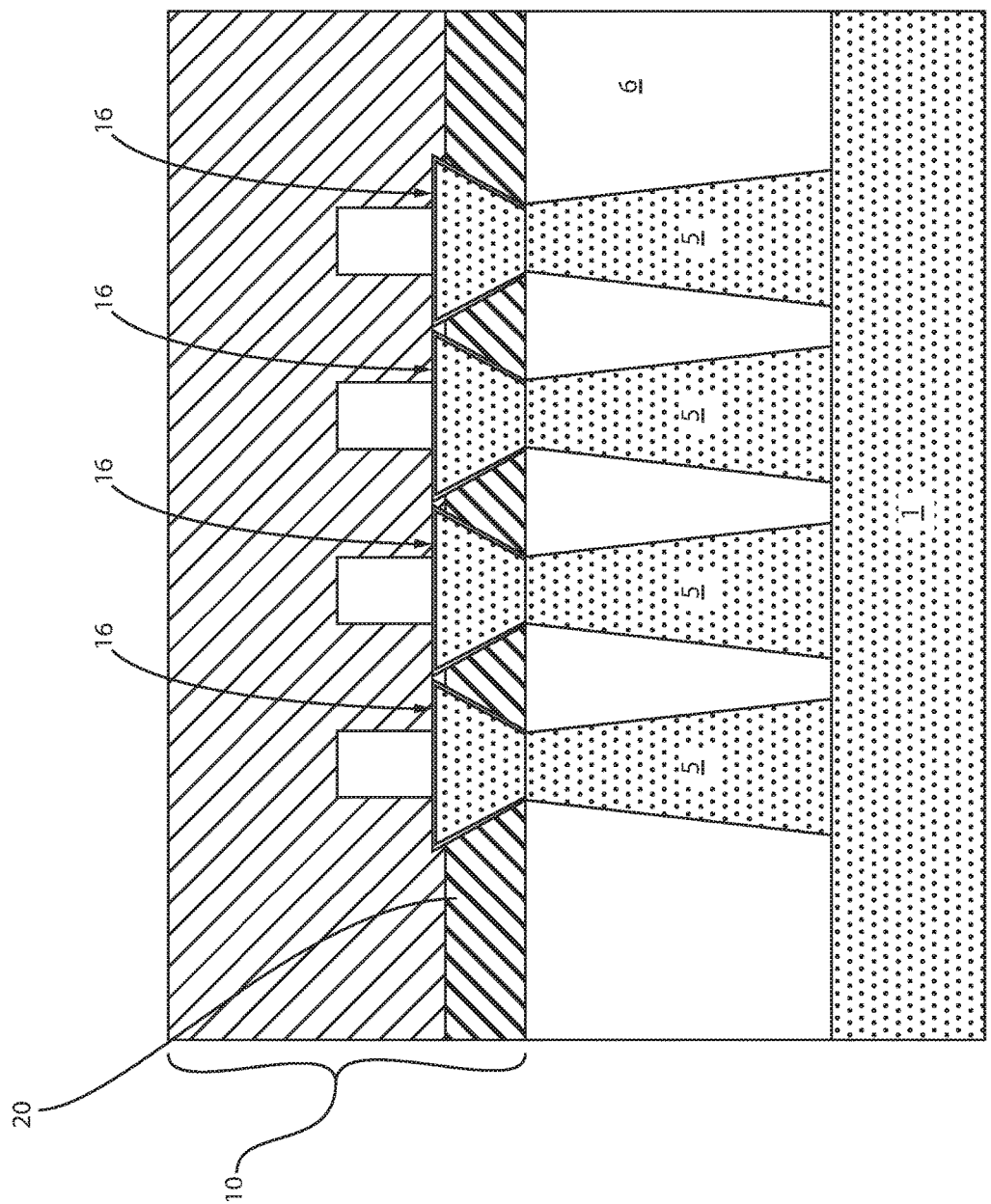
FIG. 6 is an across-fin side cross-sectional view depicting an etch process for removing the upper portion of the first epitaxial semiconductor material to expose a (110) orientation surface upper surface of the first epitaxial semiconductor material, in accordance with one embodiment of the present disclosure.

FIG. 6 depicts one embodiment of an etch process for removing the upper portion of the first epitaxial semiconductor material 15 to expose a second crystalline orientation surface 16, e.g., (100) orientation surface, for the upper surface of the recessed first epitaxial semiconductor material 15. The etch process removes the portion, i.e., upper portion, of the first epitaxial semiconductor material 15 that extends to the apexes A1 on the sidewalls of the first epitaxial semiconductor material 15. For example, the etch process may remove the upper apex A2 of the first epitaxial semiconductor material 15 producing a planar upper surface. The planar upper surface of the first epitaxial semiconductor material 15 may be positioned at substantially a widest point of the original diamond geometry of the first epitaxial semiconductor 15. The planar upper surface of the recessed first epitaxial semiconductor material 15 may be coplanar with the upper surface of the blocking material 15. The etch process for removing the upper portion of the first epitaxial semiconductor material 15 may be selective to the blocking material 20. Therefore, the blocking material 20 can protect the lower half of the first epitaxial semiconductor material 15 from being etched.

The etch process for removing the upper portion of the first epitaxial semiconductor material 15 may be an anisotropic etch. The anisotropic etch may include reactive-ion etching (RIE), ion beam etching, plasma etching or laser ablation. The etch process may also be timed and/or employ end point detection methods to determine when the etch process has recessed the upper surface of the first epitaxial semiconductor material 15 to be substantially coplanar with the upper surface of the blocking material 20.

The planar upper surface of the recessed first epitaxial semiconductor material 15 may provide a deposition surface having a second crystalline orientation for forming merged epitaxial semiconductor material. The deposition surface may have a crystalline orientation that favors epitaxial growth of a rectangular geometry. In some embodiments, the planar upper surface of the first epitaxial semiconductor material 15 that is produced by the etch step described with reference to FIG. 6 is along a resulting plane that is (100).

Figure 7:
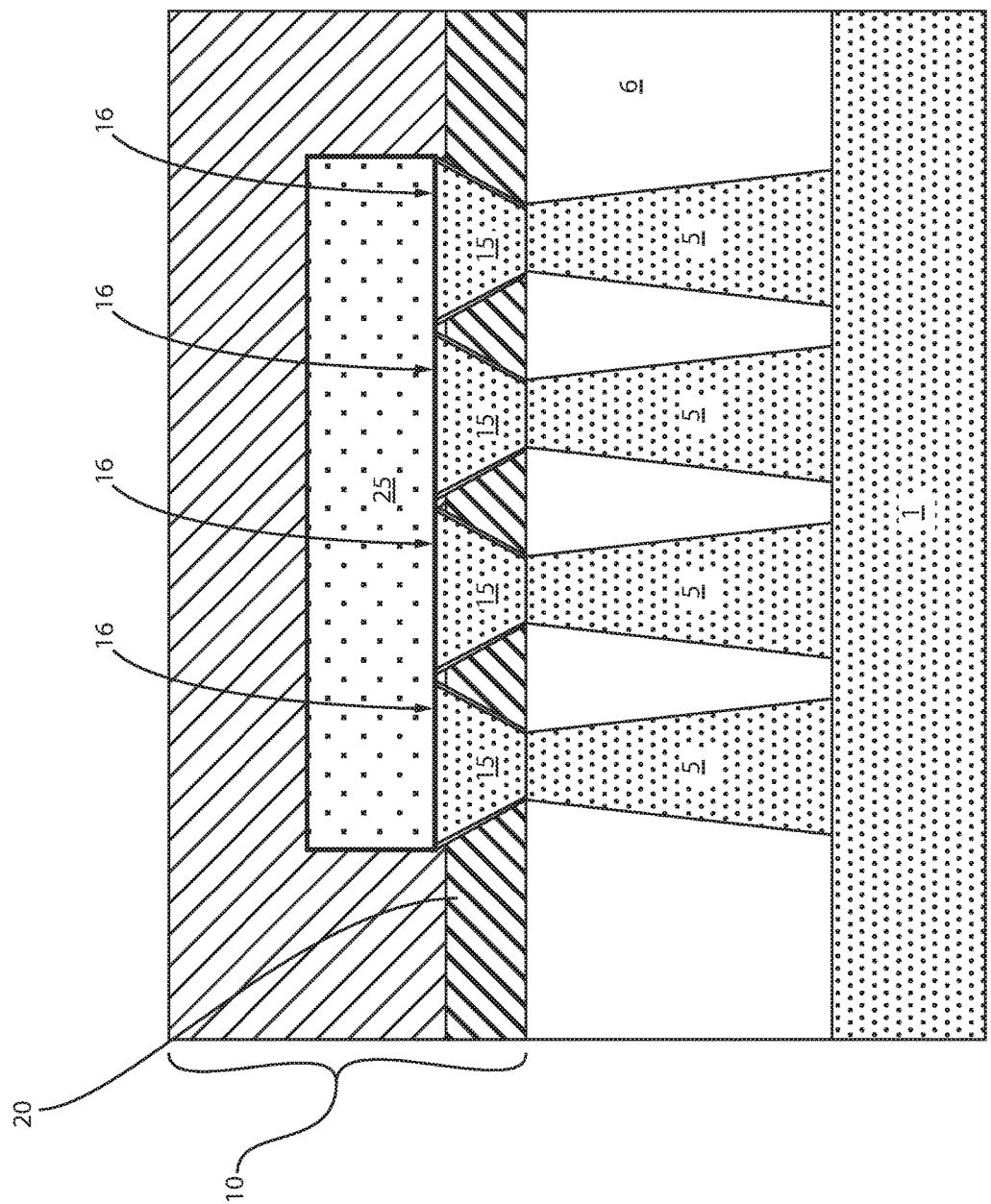
FIG. 7 is an across-fin side cross-sectional view depicting one embodiment of forming a second epitaxial semiconductor material on at least the (100) orientation surface of first epitaxial semiconductor material, the second epitaxial semiconductor material providing a merged epitaxial material that extends into direct contact with at least two adjacent fin structures of the plurality of fin structures.

FIG. 7 depicts one embodiment of forming a second epitaxial semiconductor material 25 on at least the (100) orientation surface of first epitaxial semiconductor material 15, the second epitaxial semiconductor material 25 providing a merged epitaxial material that extends into direct contact with at least two adjacent fin structures 15 of the plurality of fin structures. The second epitaxial semiconductor material 25 being epitaxially grown on the (100) plane of the recessed upper surface of the first epitaxial semiconductor material 15 may be rectangular in geometry. This means that the outermost sidewall of the epitaxial semiconductor material is parallel to the sidewall of the fin structures. This is distinguished from epitaxial semiconductor material that has a diamond like geometry. With a diamond like geometry instead of having an outer sidewall that is parallel to the outer sidewall of the fin structures, the diamond like geometry have a peaked sidewall or a sidewall having an apex positioned approximately at half the height of the epitaxial material. The second epitaxial semiconductor material 25 having the rectangular geometry has a defect density that is less than the defect density of epitaxial semiconductor material that has a diamond geometry. In some embodiments, the defect density of the second epitaxial semiconductor material 25 may range from $1 \times 10^4$ cm$^{-2}$ to 1 cm$^{-2}$. In another embodiment, the defect density of the second epitaxial semiconductor material 25 may range from $1 \times 10^3$ cm$^{-2}$ to $1 \times 10$ cm$^{-2}$.

The second epitaxial semiconductor material 25 may have the same or different composition as the first epitaxial semiconductor material 15. The second epitaxial semiconductor material 25 may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. The second epitaxial semiconductor material 25 is grown using an epitaxial growth or deposition process. A number of different sources may be used for the epitaxial deposition of the second epitaxial semiconductor material 25. For example, a silicon including second epitaxial semiconductor material 25 may be deposited from a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming the second epitaxial semiconductor material 25 include germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

The second epitaxial semiconductor material 25 provides a portion of the source and drain regions of the semiconductor device including the fin structure, and therefore is typically doped to an n-type or p-type conductivity. In a type IV semiconductor, such as silicon, examples of p-type dopants, i.e., impurities, include but are not limited to, boron, aluminum, gallium and indium. In a type IV semiconductor, such as silicon, examples of n-type dopants, i.e., impurities, include but are not limited to antimony, arsenic and phosphorous. The dopant for the epitaxial semiconductor material that dictates the conductivity type of the second epitaxial semiconductor material 25 is typically present in a concentration ranging from 1E17 atoms/cm$^3$ to 5E19 atoms/cm$^3$. The second epitaxial semiconductor material 25 is typically doped to a same conductivity type as the first epitaxial semiconductor material 15.

The dopant for the second epitaxial semiconductor material 25 may be introduced to the semiconductor material by an in situ doping process. In one embodiment, the n-type gas dopant source for the second epitaxial semiconductor material 25 may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). The p-type gas dopant source for the second epitaxial semiconductor material 25 may include diborane ($B_2H_6$).

The epitaxial growth process for forming the second epitaxial semiconductor material 25 may continue until the sidewalls of the second epitaxial semiconductor material 25 that are present on the adjacent fin structures touch to provide a merged epitaxial semiconductor material.

The method may continue with replacing the sacrificial gate structure 10 with a functional gate structure. The "functional gate structure" operates to switch the semiconductor device from an "on" to "off" state, and vice versa. The functional gate structure typically includes at least on gate dielectric and at least one gate conductor. Substituting the sacrificial gate structure 10 with a functional gate structure may begin with forming an interlevel dielectric layer may be formed overlying the structure, and planarizing the interlevel dielectric layer to be coplanar with an upper surface of the sacrificial gate structure 10. The sacrificial gate structure 10 may then be removed by an etch that is selective to the fin structures 5 and the interlevel dielectric layer. The etch may also be selective to the gate sidewall spacers 11. Removing the sacrificial gate structure 10 provides a gate structure opening to the channel region portion of the fin structures 5. The functional gate structure is formed in the gate structure opening.

The functional gate structure may include at least one gate dielectric. In one embodiment, the at least one gate dielectric includes, but is not limited to, an oxide, nitride, oxynitride and/or silicates including metal silicates, aluminates, titanates and nitrides. In one example, when the at least one gate dielectric is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The at least one gate dielectric may be formed using a deposition process, such as chemical vapor deposition (CVD). Examples of CVD processes for forming the at least one gate dielectric include chemical vapor deposition (CVD), plasma enhanced chemical vapor deposition (PECVD), physical vapor deposition (PVD), atomic layer deposition (ALD) and other like deposition processes. The at least one gate dielectric may also include material layers formed using a thermal growth process, such as thermal oxidation.

The functional gate structure may also include a gate conductor that is formed atop the at least one gate dielectric. The conductive material of the gate conductor may comprise polysilicon, SiGe, a silicide, a metal or a metal-silicon-nitride such as Ta—Si—N. Examples of metals that can be used as the gate conductor include, but are not limited to, Al, W, Cu, and Ti or other like conductive metals. The layer of conductive material for the gate conductor may be doped or undoped. If doped, an in-situ doping deposition process may be employed. Alternatively, a doped conductive material can be formed by deposition, ion implantation and annealing. The at least one gate conductor may be formed using a deposition process. For example, when the at least one gate conductor is composed of a semiconductor material, the at least one gate conductor may be formed using may be formed using a deposition process, such as chemical vapor deposition (CVD). In another embodiment, when the at least one gate conductor is composed of a metal, the at least one gate conductor is formed using a physical vapor deposition (PVD) process, such as sputtering. Examples of sputtering apparatus that may be suitable for depositing the at least one gate conductor include DC diode type systems, radio frequency (RF) sputtering, magnetron sputtering, and ionized metal plasma (IMP) sputtering.

In another embodiment, the process sequence for forming the FinFET structure depicted in FIG. 7 is formed using a gate first process sequence, which is not depicted in the supplied figures. The method depicted in FIGS. 1-7 is a gate last process that includes forming a replacement gate structure. In another embodiment, a functional gate structure is formed instead of a replacement gate structure, and the functional gate structure remains throughout the formation of the fin structure. This is referred to as a gate first process sequence. Both gate first and gate last process sequences are applicable to the present disclosure.

In one embodiment, the above described method provides an electrical device that includes a plurality of fin structures 5; and a multi-component merged epitaxial semiconductor material on the source and drain region portions of the plurality of fin structures 5, as depicted in FIG. 7. The multi-component merged epitaxial semiconductor material comprising a first component, i.e., first epitaxial semiconductor material 15, comprising angled sidewalls and an increasing width from a base of the first component of the epitaxial material to an interface with a second component of the multi-component merged epitaxial semiconductor material. The second component, i.e., second epitaxial semiconductor material 25, of the multi-component merged epitaxial semiconductor material is in direct contact with an upper surface of the first component and is composed of merged epitaxial semiconductor material. The second component of the multi-component merged epitaxial semiconductor material has a substantially planar upper surface. For example, the substantially planar upper surface of the second component may be free of epitaxial nodules. The first component of the multi-component merged epitaxial semiconductor material is non-merged epitaxial material. In some embodiments, a dielectric material, i.e., blocking material 20, is present between said angled sidewalls of the first components of the multi-component merged epitaxial semiconductor material between adjacent fin structures. The multi-component merged epitaxial semiconductor material can be doped with a p-type or n-type dopant to provide a source and drain region of a fin type field effect transistor (FinFET). In some embodiments, the defect density of the multi-component merged epitaxial semiconductor material may range from $1 \times 10^5$ cm$^{-2}$ to 1 cm$^{-2}$. In another embodiment, the defect density of the multi-component merged epitaxial semiconductor material may range from $1 \times 10^4$ cm$^{-2}$ to 10 cm$^{-2}$.

The methods and structures that have been described above with reference to FIGS. 1-7 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
    forming a blocking material protecting a lower portion of a first epitaxial semiconductor material having a diamond geometry on a plurality of fin structures and leaving an upper portion of the first epitaxial semiconductor material exposed;
    removing an apex portion of the first epitaxial semiconductor material to expose a second orientation surface of the first epitaxial semiconductor material having a planar upper surface for merged epitaxial semiconductor growth, wherein an entirety of sidewalls of the first epitaxial semiconductor material tapers with a decreasing width dimension in a direction extending from the planar upper surface to a base of the first epitaxial semiconductor material; and
    epitaxially forming a second epitaxial semiconductor material on the first epitaxial semiconductor material, the second epitaxial semiconductor material having a rectangular geometry and extending into contact with at least two adjacent fin structures of said plurality of fin structures.

2. The method of claim 1, further comprising forming a sacrificial gate structure on a channel region portion of the fin structures before forming said first epitaxial semiconductor material.

3. The method of claim 2, further comprising substituting the sacrificial gate structure with a functional gate structure after forming the second epitaxial semiconductor material.

4. The method of claim 1, wherein the diamond geometry is formed on an epitaxial growth surface comprising a (110) surface.

5. The method of claim 1, wherein the first epitaxial semiconductor material having the diamond geometry is non merged epitaxial semiconductor material.

6. The method of claim 1, wherein said forming the blocking material protecting the lower portion of the first epitaxial semiconductor material comprises depositing the blocking material to a height below a sidewall apex of the first epitaxial semiconductor material having the diamond geometry.

7. The method of claim 1, wherein said removing the upper portion of the first epitaxial semiconductor material to expose the second orientation surface of the first epitaxial semiconductor material for merged epitaxial semiconductor growth comprises an anisotropic etch.

8. The method of claim 1, wherein the second orientation surface is a (100) crystal plane.

9. A method of forming a semiconductor device comprising:
    removing an apex portion of a first epitaxial semiconductor material having a diamond geometry that is present on a plurality of fin structures to expose a second orientation surface of the first epitaxial semiconductor material having a planar upper surface for merged epitaxial semiconductor growth, wherein an entirety of sidewalls of the first epitaxial semiconductor material tapers with a decreasing width dimension in a direction extending from the planar upper surface to a base of the first epitaxial semiconductor material; and
    epitaxially forming a second epitaxial semiconductor material on the first epitaxial semiconductor material, the second epitaxial semiconductor material having a rectangular geometry and extending into contact with at least two adjacent fin structures of said plurality of fin structures.

10. The method of claim 9, further comprising forming a sacrificial gate structure on a channel region portion of the fin structures before forming said first epitaxial semiconductor material.

11. The method of claim 10, further comprising substituting the sacrificial gate structure with a functional gate structure after forming the second epitaxial semiconductor material.

12. The method of claim 9, wherein the diamond geometry is formed on an epitaxial growth surface comprising a (110) surface.

13. The method of claim 9, wherein the first epitaxial semiconductor material having the diamond geometry is non merged epitaxial semiconductor material.

14. The method of claim 9, wherein said removing the apex portion of the first epitaxial semiconductor material having the diamond geometry comprises depositing a blocking material protecting a lower portion of the first epitaxial semiconductor material.

15. The method of claim 14, wherein said depositing the blocking material protecting the lower portion of the first epitaxial semiconductor material comprises depositing the blocking material to a height below a sidewall apex of the first epitaxial semiconductor material having the diamond geometry.

16. The method of claim 15, wherein said removing the upper portion of the first epitaxial semiconductor material to expose the second orientation surface of the first epitaxial semiconductor material for merged epitaxial semiconductor growth comprises an anisotropic etch.

17. The method of claim 16, wherein the second orientation surface is a (100) crystal plane.

* * * * *